United States Patent
Liao et al.

(10) Patent No.: US 12,176,217 B2
(45) Date of Patent: *Dec. 24, 2024

(54) METHOD FOR MANUFACTURING A SEMICONDUCTOR USING SLURRY

(71) Applicant: TAIWAN SEMICONDUCTOR MANUFACTURING COMPANY LTD., Hsinchu (TW)

(72) Inventors: Chun-Hung Liao, Taichung (TW); Chung-Wei Hsu, Hsinchu County (TW); Tsung-Ling Tsai, Hsinchu (TW); Chen-Hao Wu, Hsinchu (TW); An-Hsuan Lee, Hsinchu (TW); Shen-Nan Lee, Hsinchu County (TW); Teng-Chun Tsai, Hsinchu (TW); Huang-Lin Chao, Hillsboro, OR (US)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 29 days.

This patent is subject to a terminal disclaimer.

(21) Appl. No.: 18/319,454

(22) Filed: May 17, 2023

(65) Prior Publication Data

US 2023/0290641 A1   Sep. 14, 2023

Related U.S. Application Data

(60) Continuation of application No. 16/940,287, filed on Jul. 27, 2020, now Pat. No. 11,688,607, which is a
(Continued)

(51) Int. Cl.
*H01L 21/3105* (2006.01)
*C09G 1/02* (2006.01)
(Continued)

(52) U.S. Cl.
CPC .......... *H01L 21/31053* (2013.01); *C09G 1/02* (2013.01); *C09K 3/1409* (2013.01); *C23F 1/12* (2013.01); *H01L 21/02019* (2013.01); *H01L 21/30625* (2013.01); *H01L 21/3063* (2013.01); *H01L 21/31055* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 2015/0041854 A1* | 2/2015 | Wang | H01L 29/66795 257/190 |
| 2017/0029664 A1* | 2/2017 | Park | H01L 29/66795 |
| 2017/0053915 A1* | 2/2017 | Ando | H01L 21/28255 |

* cited by examiner

*Primary Examiner* — Stephanie P Duclair
(74) *Attorney, Agent, or Firm* — WPAT LAW; Anthony King

(57) ABSTRACT

The present disclosure provides a method for manufacturing a semiconductor. The method includes: forming a metal oxide layer over a gate structure over a substrate; forming a dielectric layer over the metal oxide layer; forming a metal layer over the metal oxide layer; and performing a chemical mechanical polish (CMP) operation to remove a portion of the dielectric layer and a portion of the metal layer, the CMP operation stopping at the metal oxide layer, wherein a slurry used in the CMP operation includes a ceria compound. The present disclosure also provides a method for planarizing a metal-dielectric surface.

20 Claims, 16 Drawing Sheets

Related U.S. Application Data division of application No. 16/170,539, filed on Oct. 25, 2018, now Pat. No. 10,727,076.

(51) Int. Cl.
    *C09K 3/14*     (2006.01)
    *C23F 1/12*     (2006.01)
    *H01L 21/02*     (2006.01)
    *H01L 21/306*     (2006.01)
    *H01L 21/3063*     (2006.01)
    *H01L 21/311*     (2006.01)

METHOD FOR MANUFACTURING A SEMICONDUCTOR USING SLURRY

CROSS REFERENCE TO RELATED APPLICATION

This application is a continuation of prior-filed application Ser. No. 16/940,287, filed Jul. 27, 2020, which is a divisional of prior-filed application Ser. No. 16/170,539, filed Oct. 25, 2018, and claims the priority thereto.

BACKGROUND

In the production processes for semiconductor devices, a polishing process is carried out to subject a surface of a wafer to a planarization. A polishing process can be applied to different materials of surfaces of the wafer multiple times during different stages of fabrication processing of a semiconductor device. In the process of chemical mechanical polishing, the wafer is mounted to a rotating plate, and a surface of the wafer is brought into contact with a pad of a polishing machine. Rotating the rotating plate and the pad of the polishing machine while a slurry is supplied. That is, a slurry flows between the wafer surface and the pad, and polishing of the wafer surface is achieved as a result of the mechanical friction caused by the polishing particles in the slurry and the protrusions at the surface of the pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 is a flow chart of a method for planarizing a metal-dielectric surface according to various aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A chemical mechanical polish (CMP) operation is commonly used in various stages of a semiconductor manufacturing process. As for advanced process of semiconductor manufacturing, a metal material is applied in formation of a contact to a source/drain region of a transistor. A slurry used in the CMP operation includes abrasives for the purpose of mechanical force increment. Considering high hardness of metal material, a slurry having a high hardness of abrasive as its advantages in high removal rate to metal material by mechanical force is used when the removal target is metal material in the CMP operation. In order to control CMP operation, a stop layer is applied for detection of termination of the CMP operation. A stop layer ideally should have high selectivity to the target material under a predetermined slurry. However, it is difficult to have high selectivity between the target layer and the stop layer under a condition of high mechanical force being applied.

For example, $SiO_2$, SiN and Si are widely used as hard mask for wafer patterning to enhance patterning precision. For more delicate and tinier patterns, novel candidate such as transition metal oxide (e.g., $HfO_2$, $ZrO_2$, $Y_2O_3$, $TiO_2$, $Al_2O_3$, $Ta_2O_5$, $La_2O_3$, etc.) were introduced to enhance etch rate selectivity. By introducing transition metal oxide, higher aspect ratio with less mask loss can be achieved. However, transition metal oxide is hard to act as a stopping layer during CMP process. This disadvantage will lead to unwanted thickness loss during the CMP process and make such process more difficult to control. Without chelating agent, polishing driving force of traditional $SiO_2$ abrasive to transition metal oxide is mainly mechanical.

Present disclosure provides a CMP slurry utilizing a new abrasive to replace traditional $SiO_2$ abrasive in metal CMP operations so as to effectively suppress (transition) metal oxide removal rate while maintain the removal rate for other materials during the metal CMP operations. In some embodiments, Ceria oxide ($CeO_x$) is utilized as the new abrasive for metal CMP operations. Compared to traditional $SiO_2$ abrasive, Ceria oxide ($CeO_x$) possesses lower Mohs hardness and higher weight density. Consequently, lower abrasive content (in weight percent) and thus less mechanical force is applied the substance to be removed. On the other hand, the chemical force possessed by the Ceria oxide ($CeO_x$) provides another channel for planarization which is more material-specific. The reduction of the mechanical force and enhancement of chemical force allow Ceria oxide ($CeO_x$) to be a desired candidate to effectively suppress (transition) metal oxide removal rate while maintain the removal rate for other materials during the metal CMP operations.

Some embodiments of the present disclosure provide a slurry used in a chemical mechanical polish (CMP) operation for planarizing a metal-dielectric surface. The slurry includes an abrasive, a removal rate regulator and a buffering agent. The abrasive includes a ceria compound, which has a Mohs hardness less than that of silicon dioxide. The removal rate regulator is to adjust removal rates of the slurry to metal and to dielectric material, and the buffering agent is to adjust a pH value of the slurry. The slurry provided by some embodiments of the present disclosure includes a dielectric material removal rate higher than a metal oxide removal rate. The slurry provided by some embodiments of the present disclosure includes a metal removal rate higher than the metal oxide removal rate. The slurry provided by some embodiments of the present disclosure is suitable for CMP operation targeting to a surface including a portion of pure metal and a portion of silicon oxide, and the CMP operation stops at a metal oxide layer.

As shown in FIG. 1, some embodiments of the present disclosure provide a method M10 for planarizing a metal-dielectric surface, e.g. of a semiconductor substrate. The method M10 includes: (O11) providing a slurry to a metal-dielectric surface, wherein the first metal-dielectric surface includes a silicon oxide portion and a metal portion, and the slurry comprises a ceria compound; and (O12) performing a chemical mechanical polish (CMP) operation using the slurry to simultaneously remove the silicon oxide portion and the metal portion.

Figure 2:
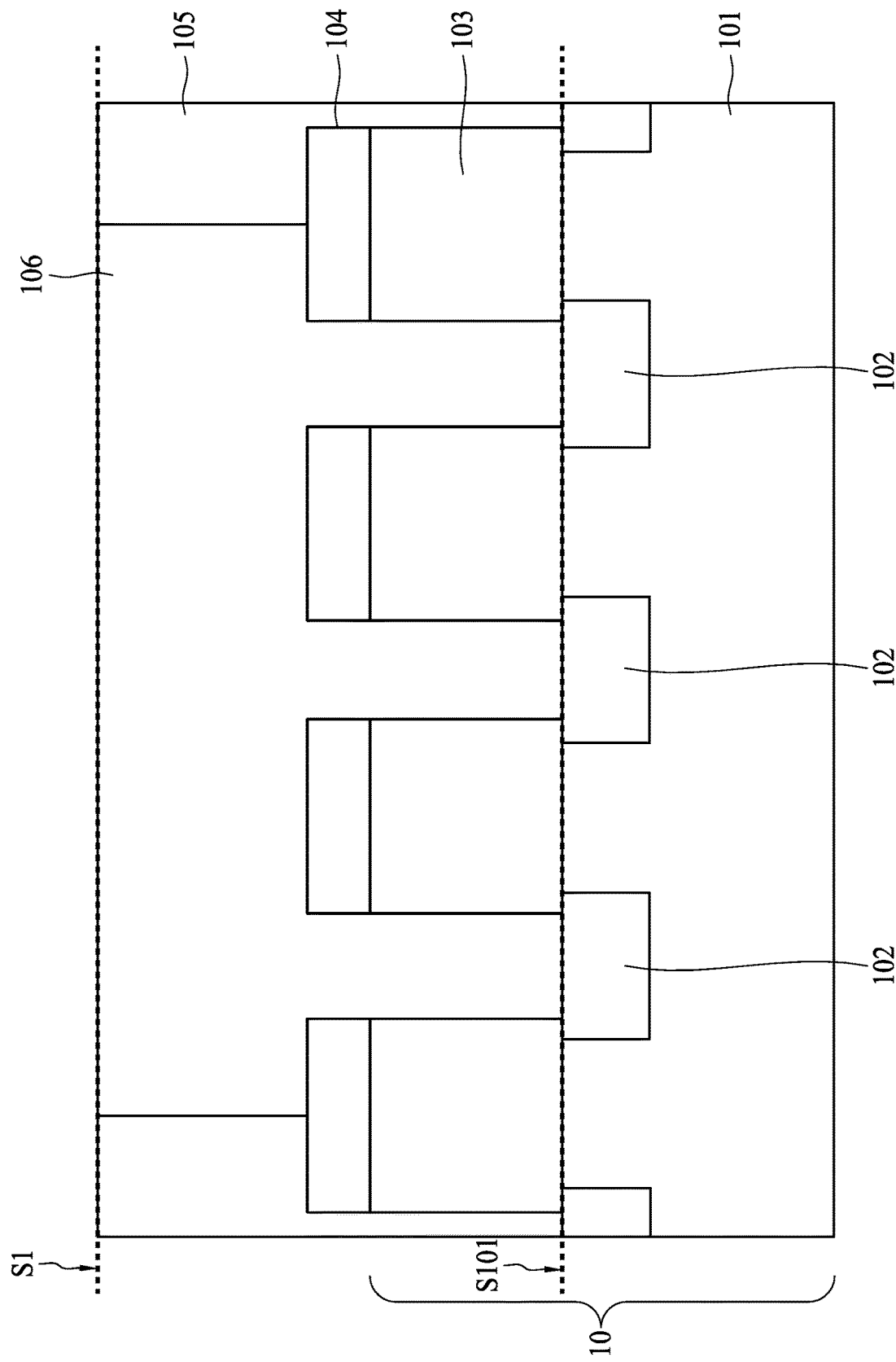
FIG. 2 to FIG. 3 are schematic cross sectional views at various operations of a method for planarizing a metal-dielectric surface according to one or more embodiments of the present disclosure.

For further illustrating the method M10, FIG. 2 is cross sectional perspective of a substrate 10 in accordance with some embodiments of the present disclosure. The method M10 is applied to the semiconductor as shown in FIG. 2. The substrate 10 including at least a semiconductor fin 101, at least a source/drain region 102, and at least a gate structure 103 is provided. Referring to FIG. 2, the cross sectional perspective along the semiconductor fin 101 of such embodiments shows a plurality of source/drain regions 102 and a plurality of gate structures 103 over the semiconductor fin 101. The source/drain regions 102 are at least partially disposed in the semiconductor fin 101, and the gate structures 103 are disposed over the semiconductor fin 101 and adjacent to the source/drain regions 102. The gate structures 103 are over and in contact with the semiconductor fin 101, and between two adjacent source/drain regions 102. In some embodiments, each of the gate structures 103 has a longitudinal direction perpendicular to a longitudinal direction of the semiconductor fin 101. In order words, each of the gate structures 103 is disposed across the semiconductor fin 101, and the semiconductor fin 101 is perpendicular to each of the gate structures 103 from a top view perspective (not shown).

The gate structures 103 can be metal gate structures in some embodiments of the present disclosure. In some embodiments, the gate structure 103 includes a metal gate electrode, a gate oxide, a pair of spacers, and a nitride contact. For example, the gate oxide is between the gate electrode and the semiconductor fin 101, the nitride contact is over the gate electrode, and the spacers are disposed on lateral sidewalls of the stack of the gate oxide, the gate electrode and the nitride contact. Details of the gate structure 103 are omitted herein. Different types of gate structures can be applied, and it is not limited herein. Shapes and configurations of the gate structures 103 can be adjusted depending on different applications. FIG. 2 is for illustration of relative positions of the semiconductor fin 101, the source/drain regions 102, and the gate structures 103 according to some embodiments from a cross section perspective, but not intended to limit the present disclosure.

A plurality of portions of a metal oxide layer 104 is formed on the gate structures 103 individually. A dielectric layer 105 is formed over the semiconductor fin 101, the source/drain regions 102, the gate structures 103 and the metal oxide layer 104. A metal layer 106 is formed filling between the gate structures 103, between the portions of the metal oxide layer 104, and over the metal oxide layer 104. A metal-dielectric surface S1 is exposed and targeted to a CMP operation. In accordance with (O11) of the method M10, in some embodiments of the present disclosure, the dielectric layer 105 is silicon oxide, and the metal-dielectric surface S1 includes a silicon oxide portion of the dielectric layer 105 and a metal portion of the metal layer 106. A slurry includes a ceria compound as an abrasive is provided.

Figure 3:
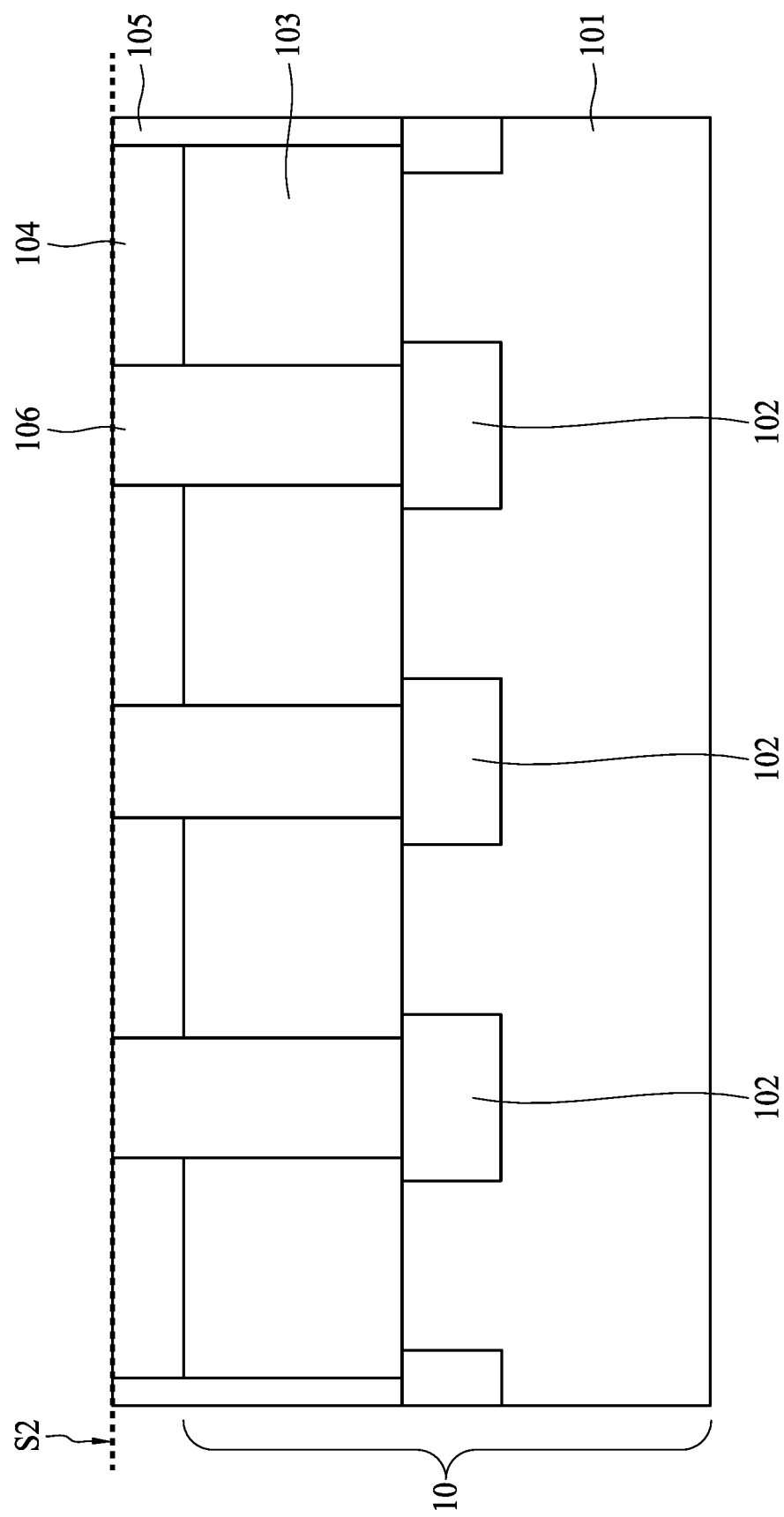

In accordance with (O12) of the method M10, a CMP operation is performed using the slurry to simultaneously remove the silicon portion and the metal portion. As shown in FIG. 3, a portion of the metal layer 106 and a portion of the dielectric layer 105 are removed, and the CMP operation stops at the metal oxide layer 104 over the gate structures 103. In some embodiments, the slurry has a dielectric material removal rate higher than a metal oxide removal rate. In some embodiments, the slurry has a metal removal rate higher than the metal oxide removal rate. In some embodiments, the slurry has a removal rate selectivity of dielectric material to metal oxide greater than 30. In some embodiments, the slurry has a removal rate selectivity of metal to metal oxide greater than 30.

In some embodiments of the present disclosure, the metal oxide layer 104 is formed over the gate structure 103 by a deposition operation. In some embodiments, the metal oxide layer 104 includes at least one of zirconium dioxide ($ZrO_2$), hafnium zirconium oxide ($HfZrO_x$), hafnium silicon oxide ($HfSiO_x$), hafnium silicon oxynitride (HfSiON), zirconium silicon oxide ($ZrSiO_x$), hafnium zirconium silicon oxide ($HfZrSiO_x$), aluminum oxide ($Al_2O_3$), hafnium aluminum oxide ($HfAlO_x$), hafnium aluminum nitride ($HfAlN_x$), zirconium aluminum oxide ($ZrAlO_x$), lanthanum oxide ($La_2O_3$), titanium dioxide ($TiO_2$), ytterbium(III) oxide ($Yb_2O_3$), yttrium(III) oxide ($Y_2O_3$), hafnium oxide ($HfO_2$) and tantalum pentoxide ($Ta_2O_5$), and x is a positive integer.

In some embodiments of the present disclosure, the dielectric layer is composed of non-metallic dielectric material. The dielectric layer includes at least one of silicon dioxide ($SiO_2$), silicon nitride (SiN), boron nitride (BN), germanium nitride (GeN), silicon carbonitride (SiCN), silicon oxycarbonitride (SiOCN), silicon oxynitride (SiON), silicon oxycarbide (SiOC).

In some embodiments of the present disclosure, the metal layer includes pure metal and alloy. Pure metal is selected from one of tungsten (W), cobalt (Co), ruthenium (Ru), copper (Cu), and alloy includes at least one of tungsten (W), cobalt (Co), ruthenium (Ru), copper (Cu).

In some embodiments of the present disclosure, the removal rate regulator is selected from a group of organic acid and ammonia. The organic acid includes amino acid and other types of organic acid. In some embodiments, the removal rate regulator is selected from a group of ammonia, amino acid, and other organic acid (besides amino acid). When the organic acid is other than amino acid, the organic acid has a functional group of R—COOH and has a molar mass in a range of 2000 and 8000 g/mol, wherein R represents a carbon chain. The removal rate regulator can be a metal removal rate enhancer or a barrier removal rate enhancer. In some embodiments, the metal removal rate enhancer is used to adjust the metal removal rate of the slurry by increase chemical force of the slurry to the metal layer 106 in order to balance an etching selectivity of metal to dielectric material of the slurry. In some embodiments, the barrier removal rate enhancer is used to adjust the dielectric removal rate of the slurry by increase chemical force of the slurry to the dielectric layer 105 in order to balance an etching selectivity of metal to dielectric material of the slurry. In some embodiments, a difference between the dielectric removal rate and the metal removal rate of the slurry can be less than 100 angstrom/minute.

In some embodiments of the present disclosure, the buffering agent includes at least one of citric acid, acetic acid and potassium dihydrogen phosphate ($KH_2PO_4$). The buffering agent is added to adjust a pH value of the slurry to be suitable for a suitable CMP condition in accordance with materials of the metal layer 106, dielectric layer 105 and the metal oxide layer 104. In some embodiments, the buffering agent has a weight percentage less than 1 wt % to the slurry. In some embodiments, the pH value of the slurry is in a range of 5 to 12. In some embodiments, the pH value of the slurry is greater than 7.

In some embodiments of the present disclosure, the abrasives consist of ceria compounds. In some embodiments, the ceria compounds of the abrasives include at least one of ceric dioxide ($CeO_2$), cerium trioxide ($Ce_2O_3$), ceric hydroxide ($Ce(OH)_4$), cerium-nitride, cerium-fluoride and cerium-sulfide. The ceria compounds have a Mohs hardness less than 7, or less than a Mohs hardness of silicon dioxide abrasives. However, the ceria compounds as the abrasives of the slurry can provide good CMP result due to chemical characteristics of the ceria compounds to the hydroxyl group on the surface of the dielectric layer 105 in aqueous medium.

As for suitable abrasives of a slurry in a CMP operation targeting to a metal-dielectric surface, ceria compounds can be in nanocrystals, having a Mohs hardness less than 7, and good dispersion property but not dissolvable in water. More importantly, ceria compounds provide chemical force in removal of the dielectric layer 105 via the illustration in FIG. 4 and FIG. 5 of present disclosure.

Figure 4:
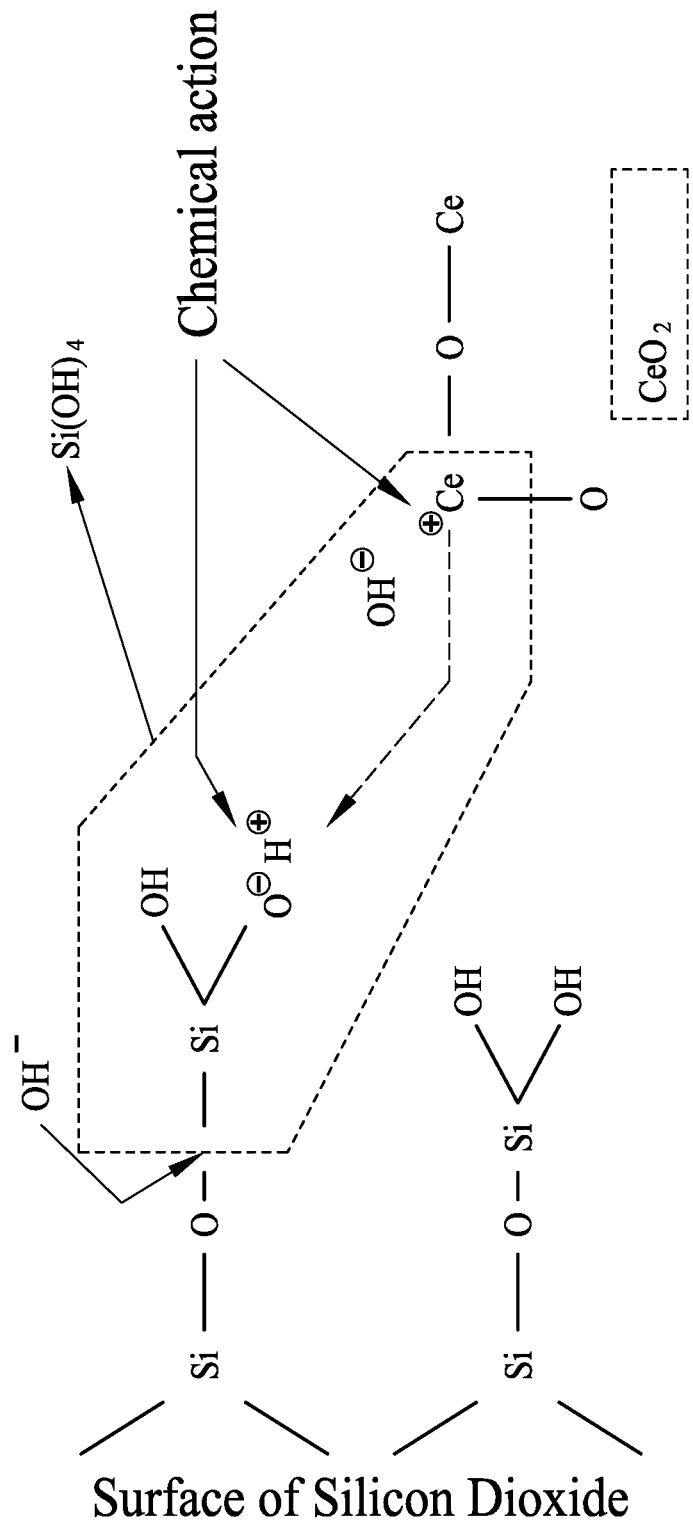
FIG. 4 and FIG. 5 are schematic diagrams showing interaction between ceria compounds and a surface of silicon dioxide according to one or more embodiments of the present disclosure.

The dielectric layer 105 being silicon dioxide for illustration, as shown in FIG. 4, an interaction between silicon dioxide and $Ce^{4+}$ under aqueous condition enhances removal rate of the slurry to the dielectric layer 105. Referring to FIG. 4, a ceria cation reacts with the hydroxyl group on the surface of the dielectric layer 105 under aqueous condition to form $Si(OH)_4$ (silicic acid). The hydroxyl groups can be generated on the ceria surface by dissociation reaction of $H_2O$ on defect site or by protonation of outermost oxygens of the surface. Ceria is functionalized with the hydroxyl groups in aqueous medium. Interactions between ceria compounds and the hydroxyl groups on the dielectric layer 105, and also interactions between hydroxyl groups and positive silicon of the dielectric layer 105 facilitate removal rate of the slurry to the dielectric layer 105.

Figure 5:
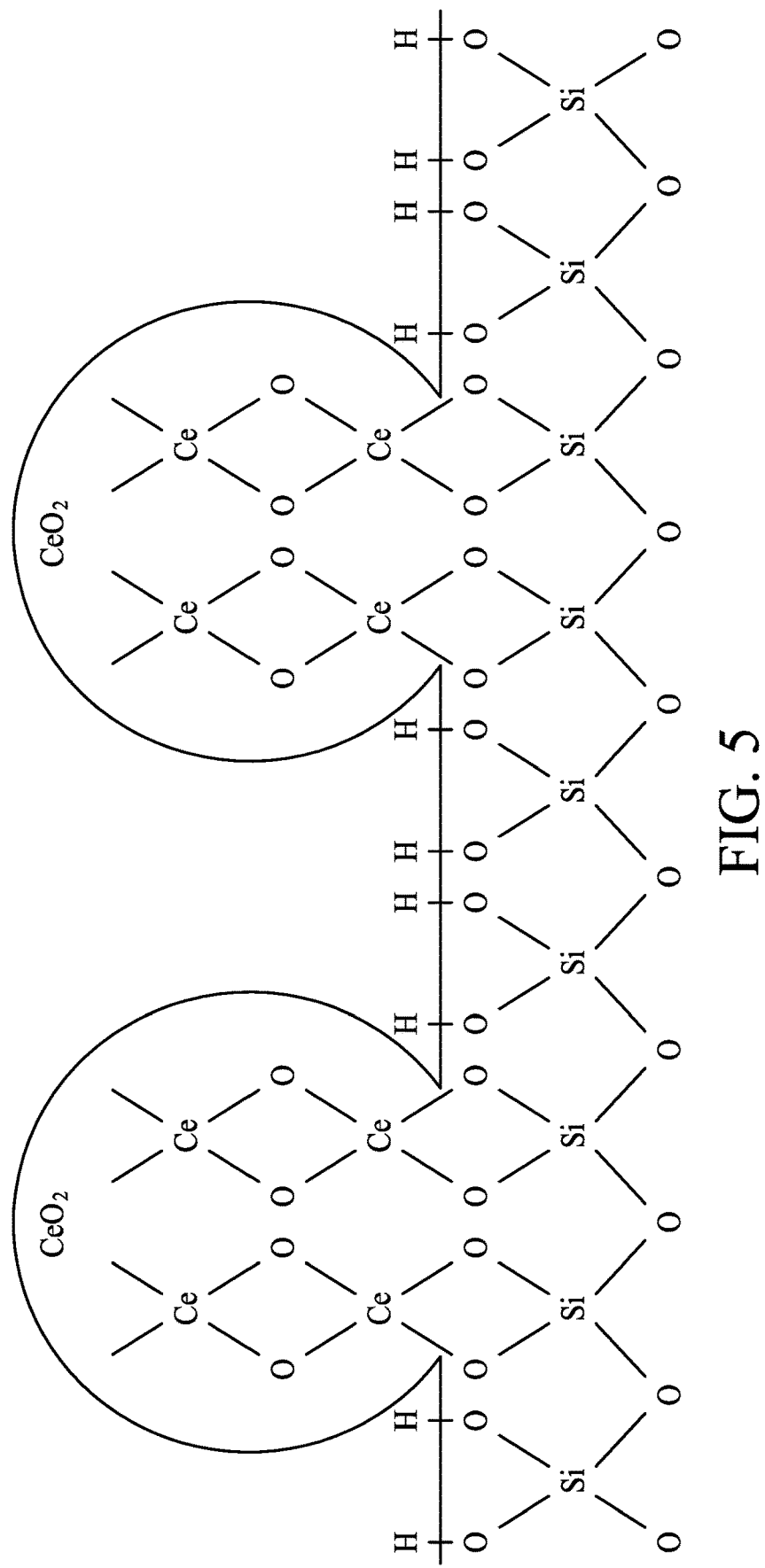

Referring to FIG. 5, due to reactions between the ceria compounds and the surface of silicon dioxide of the dielectric layer 105, during and at the end of CMP operation, the ceria compounds can be found on the surface of the dielectric layer 105. Ceria compounds in nanocrystal form can be observed by top-view electron microscopy inspection. Ceria compounds may also be identified by Energy-Dispersive X-ray Spectroscopy (EDX) mapping by showing ceria signals at the as-polished surface of the dielectric layer 105. A post-CMP cleaning operation can be optionally performed to remove the ceria compounds on the surface of the dielectric layer 105.

In some embodiments of the present disclosure, the CMP operation stops at an exposure of the metal oxide layer 104. As shown in FIG. 3, a metal-dielectric surface S2 is provided as the exposure of the metal oxide layer 104. In some embodiments, the metal-dielectric surface S2 includes a metal oxide portion of the metal oxide layer 104 and a metal portion of the metal layer 106. In some embodiments, the metal-dielectric surface S2 includes a metal oxide portion of the metal oxide layer 104, a metal portion of the metal layer 106 and a dielectric portion of the dielectric layer 105.

Figure 6:
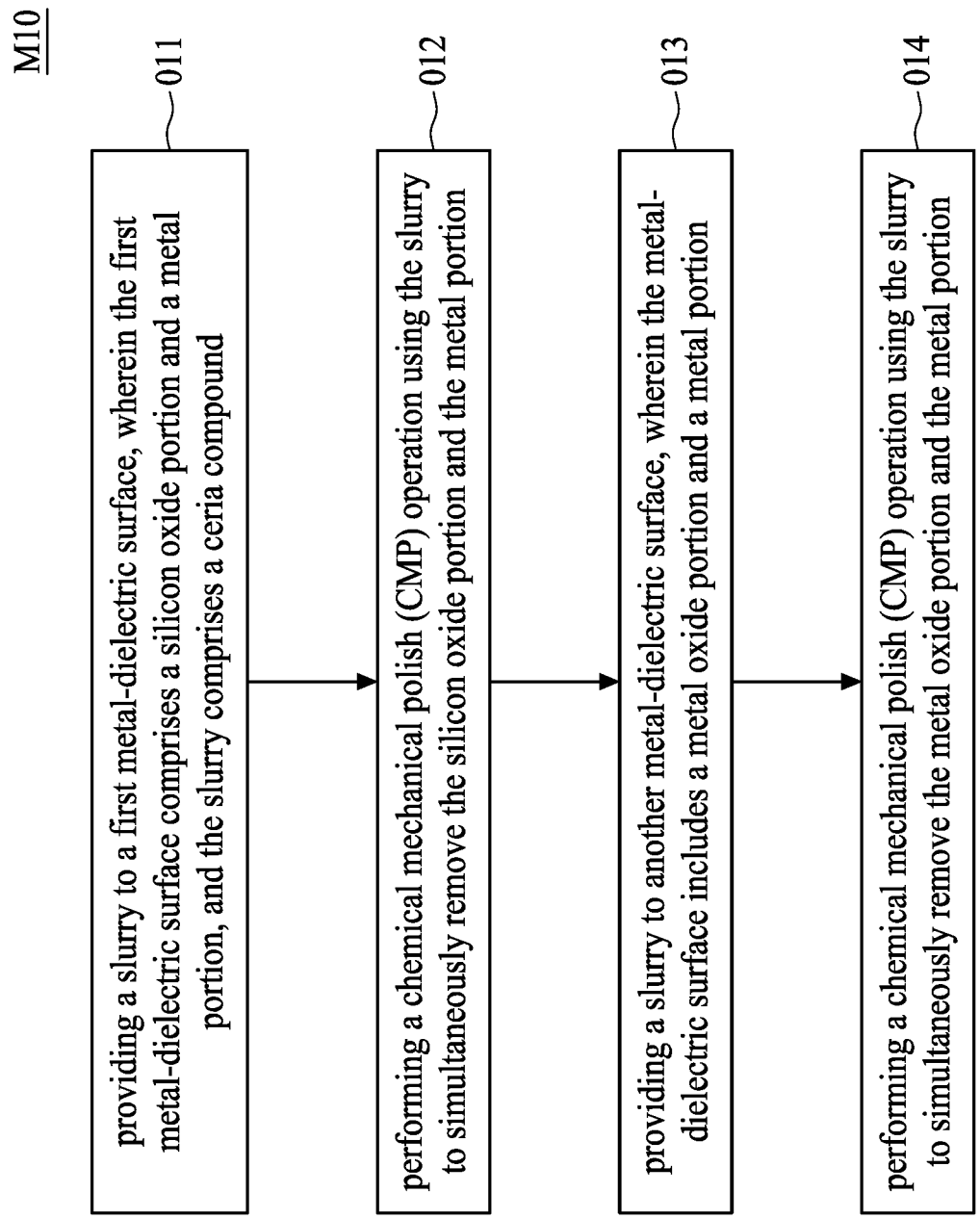
FIG. 6 is a flow chart of a method for planarizing a metal-dielectric surface according to various aspects of one or more embodiments of the present disclosure.
Figure 7:
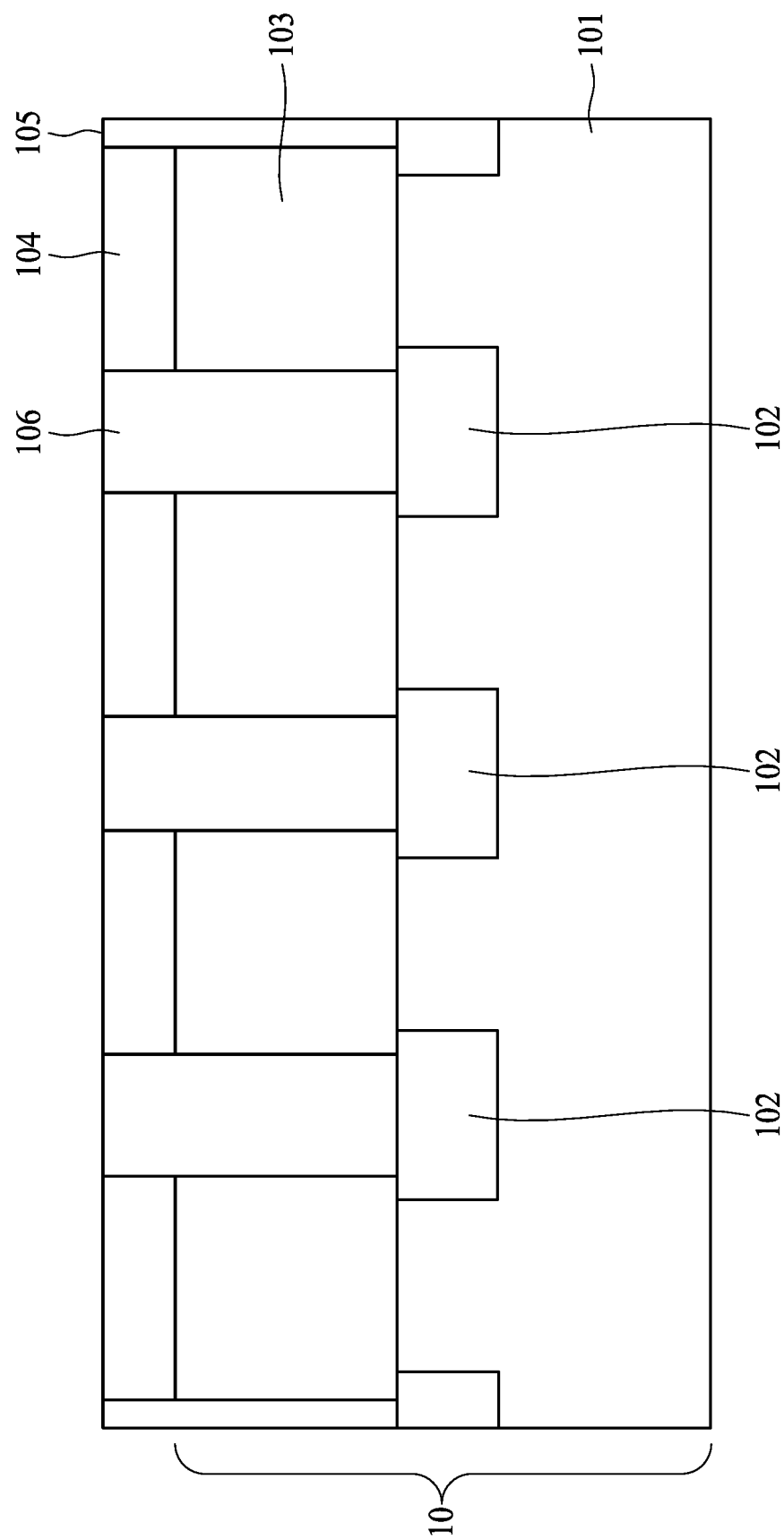
FIG. 7 is a schematic cross sectional view at one of various operations of a method for planarizing a metal-dielectric surface according to one or more embodiments of the present disclosure.

In some embodiments of the present disclosure, the CMP operation removes a portion of the metal oxide layer 104 before the CMP operation is terminated. As shown in FIG. 6 to FIG. 7, the CMP operation is continuously performed on the metal-dielectric surface S2 using the same slurry as to the metal-dielectric surface S1. A portion of the metal oxide layer 104 in thickness is removed. And the method 10 may further include: (O13) providing a slurry to another metal-dielectric surface, wherein the metal-dielectric surface includes a metal oxide portion and a metal portion; and (O14) performing a CMP operation using the slurry to simultaneously remove the metal oxide portion and the metal portion. However due to high selectivity between the metal oxide layer 104 and the metal layer 106, the removed portion of the metal oxide layer 104 in thickness can be very limited. Loss of the metal oxide layer 104 and a thickness of the metal layer 106 between the gate structures 103 (the thickness of the metal layer 106 is measured from a top of the metal layer 106 away from the semiconductor fin 101 to a bottom of the metal layer 106 in contact with the semiconductor fin 101) can be controlled.

For ease of understanding, various CMP operations for planarizing a metal-dielectric surface of different embodiments of the present disclosure are provided. And a method for manufacturing a semiconductor including a CMP operation using the above illustrated slurry is provided according to different embodiments of the present disclosure. Such embodiments are for illustration of effectiveness and advantages of slurries provided different embodiments of the present disclosure, but it is not intended to limit the present disclosure to specific embodiments.

Figure 8:
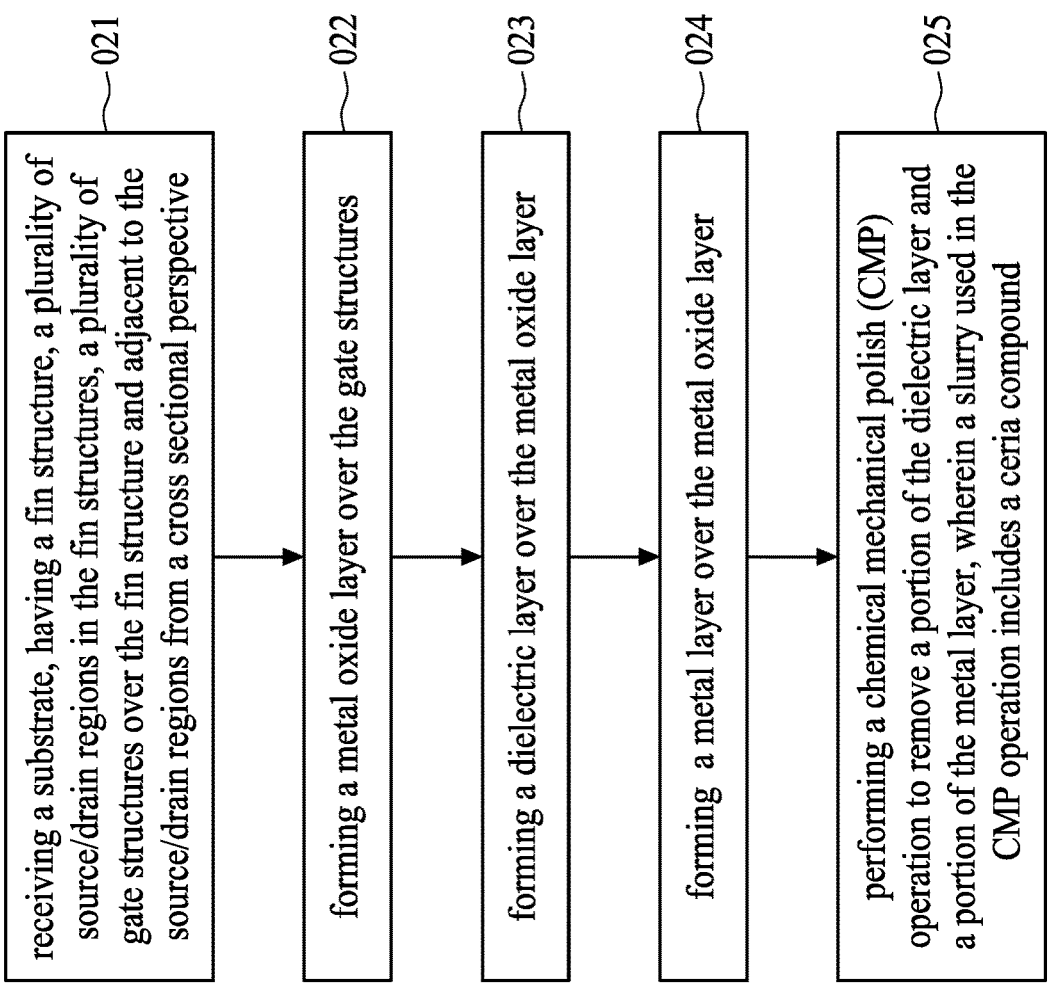
FIG. 8 is a flow chart of a method for manufacturing a semiconductor according to various aspects of one or more embodiments of the present disclosure.

As shown in FIG. 8, some embodiments of the present disclosure provide a method M20 for manufacturing a semiconductor. The method M20 includes: (O21) receiving a substrate, having a fin structure, a plurality of source/drain regions in the fin structures, a plurality of gate structures over the fin structure and adjacent to the source/drain regions from a cross sectional perspective; (O22) forming a metal oxide layer over the gate structures; (O23) forming a dielectric layer over the metal oxide layer; (O24) forming a metal layer over the metal oxide layer; and (O25) performing a chemical mechanical polish (CMP) operation to remove a portion of the dielectric layer and a portion of the metal layer, wherein a slurry used in the CMP operation comprises a ceria compound.

Figure 9:
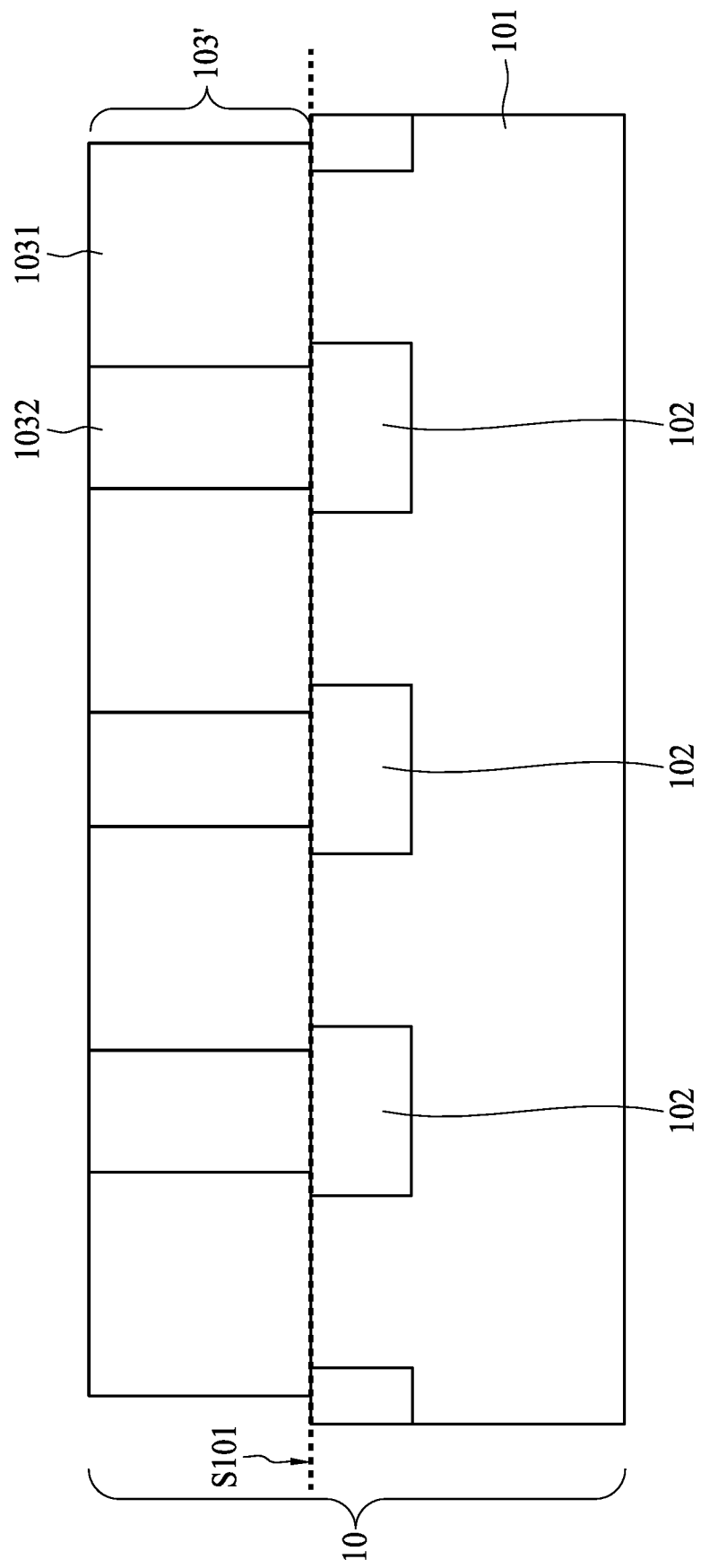
FIG. 9 to FIG. 16 are schematic cross sectional views at various operations of a method for manufacturing a semiconductor according to one or more embodiments of the present disclosure.

FIG. 9 is in accordance with some embodiments of the present disclosure for illustration of the method M20. In accordance with In accordance with (O21) of the method M20, the substrate 10 including at least a semiconductor fin 101, at least a source/drain region 102, and at least a continuous gate structure 103' is provided. Referring to FIG. 9, the cross sectional perspective of such embodiments shows a plurality of source/drain regions 102 formed in the semiconductor fin 101. The source/drain regions 102 are at least partially disposed in the semiconductor fin 101, and the continuous gate structures 103' are disposed over the semiconductor fin 101 and adjacent to the source/drain regions 102. The continuous gate structures 103' are over and in contact with the semiconductor fin 101. The continuous gate structures 103' can includes a plurality of metal gate structures 1031 and a plurality of isolations 1032. In some embodiments of the present disclosure, the isolations 1032 are composed of dielectric material and intervally disposed between the metal gate structures 1031. The metal gate structures 1031 can be similar to the metal gate structures 103 as shown in FIG. 2 to FIG. 3, and repeating description is omitted herein. The metal gate structures 1031 can be formed by using technologies of poly dummy gate formation. Details of formation of the metal gate structures 1031 are omitted herein. The isolations 1032 are made of dielectric materials, which can have similar properties to that of the dielectric layer 105 as illustrated above.

In some embodiments of the present disclosure, the source/drain regions 102 can be epitaxial structures, e.g. SiP (silicon epitaxy with in-situ P doping), SiGe (silicon germanium) or Ge (germanium). In some embodiments, the source/drain regions 102 can be formed by removing a portion of the semiconductor fin 101 and epitaxially growing crystals in the recessed portion of the semiconductor fin 101. In some embodiments, the source/drain regions 102 are formed after formation of the gate structures 103, and the source/drain regions 102 are formed between two adjacent gate structures 103. Shapes and configurations of the plurality of source/drain regions 102 can be different depending on applications. And shapes and configurations of different source/drains 102 can be also different. In some embodiments, the source/drain regions 102 are protruded from a top surface S101 of the semiconductor fin 101 depending on formations of the source/drain regions 102, and at a same level of elevation, the source/drain regions 10 are disposed intervally between the gate structures 103 over the semiconductor fin 101. FIG. 9 is for illustration of relative positions of the semiconductor fin 101, the source/drain regions 102, and the continuous gate structure 103' only but not intended to limit the present disclosure.

Figure 10:
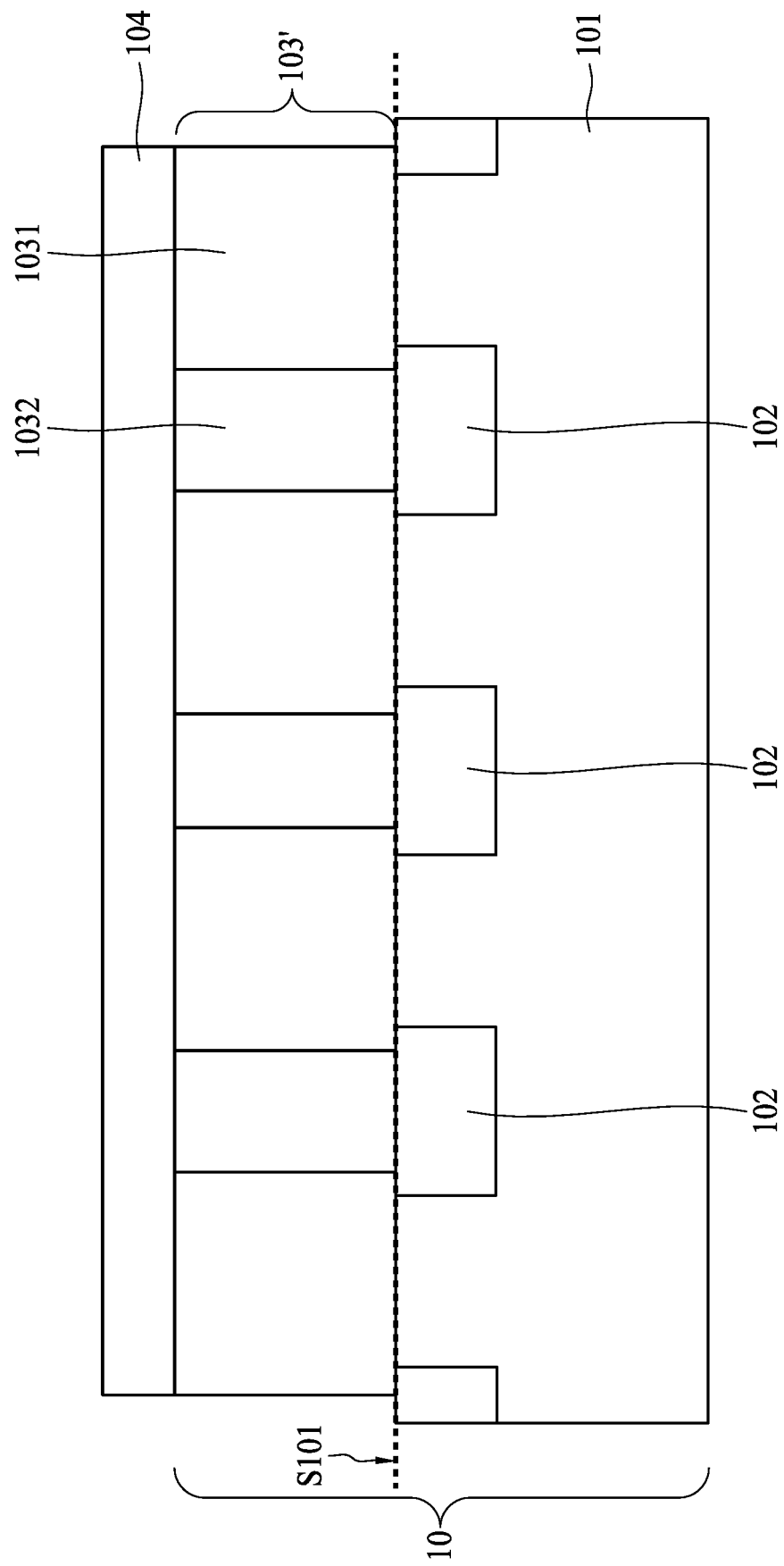
Figure 11:
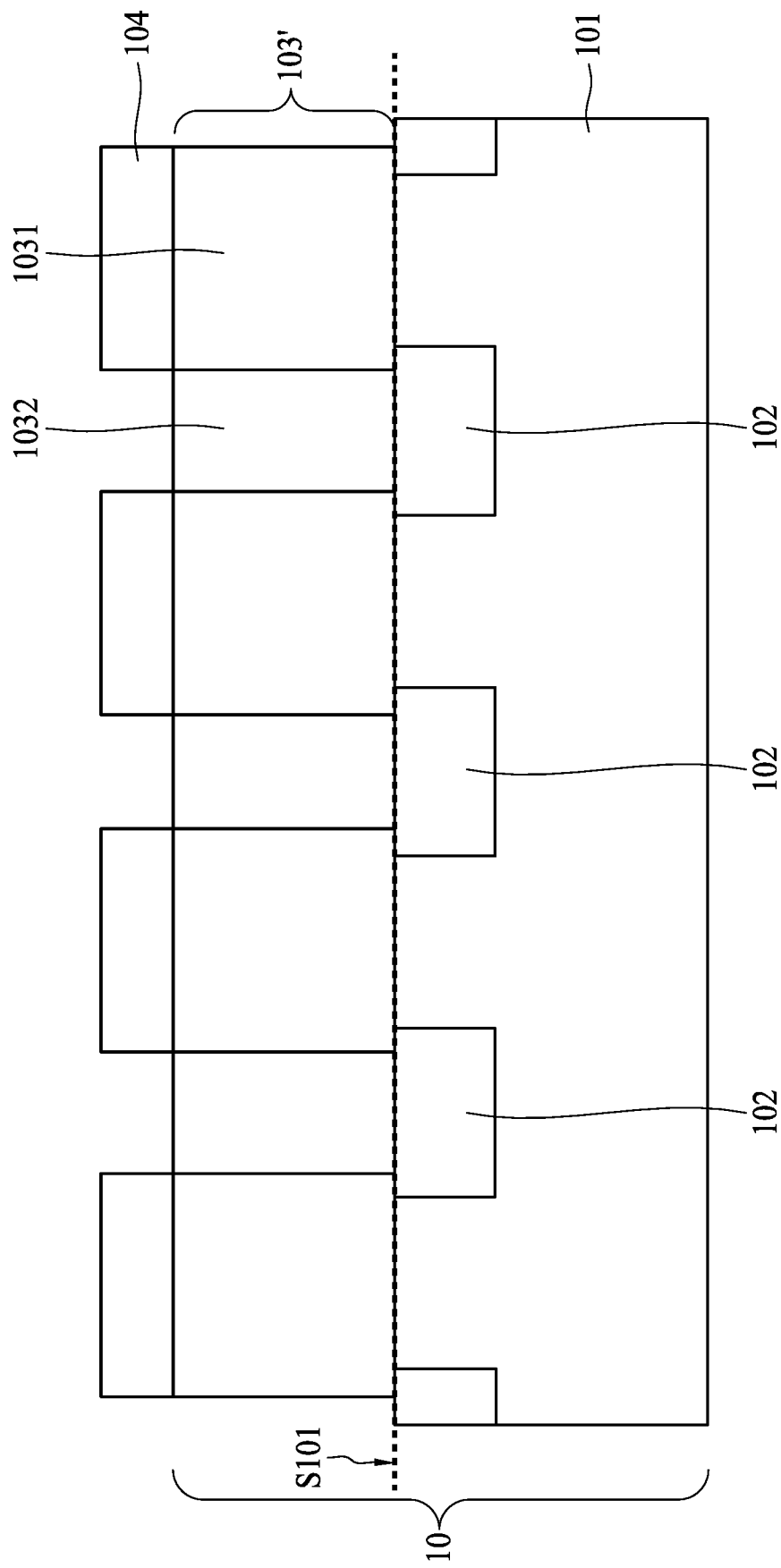

Referring to FIG. 10 to FIG. 11 and in accordance with (O22) of the method M20, a metal oxide layer 104 is formed over the continuous gate structure 103' by, for example, a deposition operation. The metal oxide layer 104 is continuously disposed over the continuous gate structure 103', covering the metal gate structures 1031 and the isolations 1032. Portions of the metal oxide layer 104 over the isolations 1032 of the continuous gate structure 103' are removed, and a plurality of remained portions of the metal oxide layer 104 is formed as shown in FIG. 11. The remained portions of metal oxide layer 104 cover the metal gate structures 1031.

Figure 12:
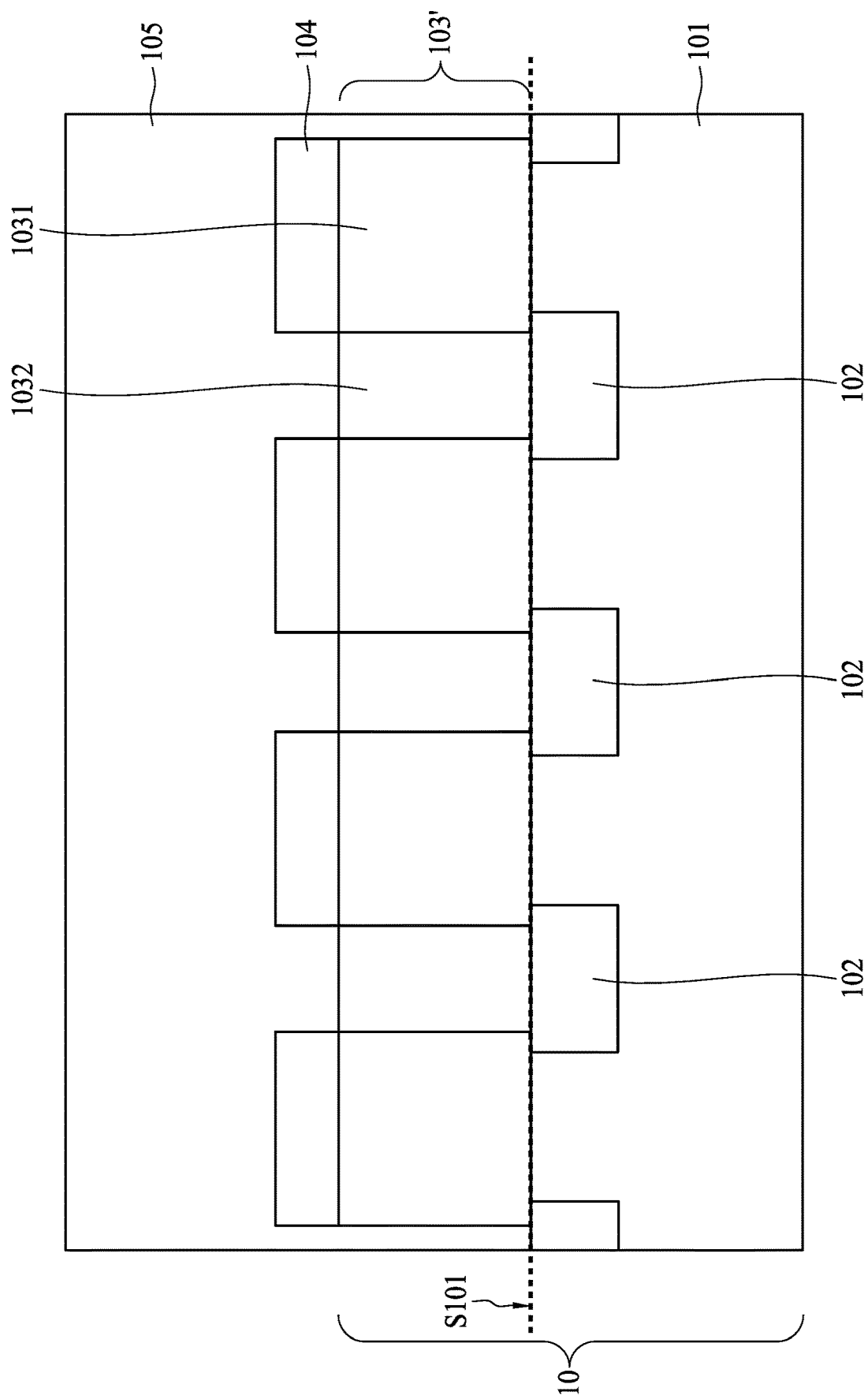

Referring to FIG. 12 and in accordance with (O23) of the method M20, a dielectric layer 105 is formed over the remained portions of the metal oxide layer 104. The dielectric layer 105 covers the semiconductor fin 101, the source/drain regions 102, the metal gate structures 1031 and the metal oxide layer 104.

Figure 13:
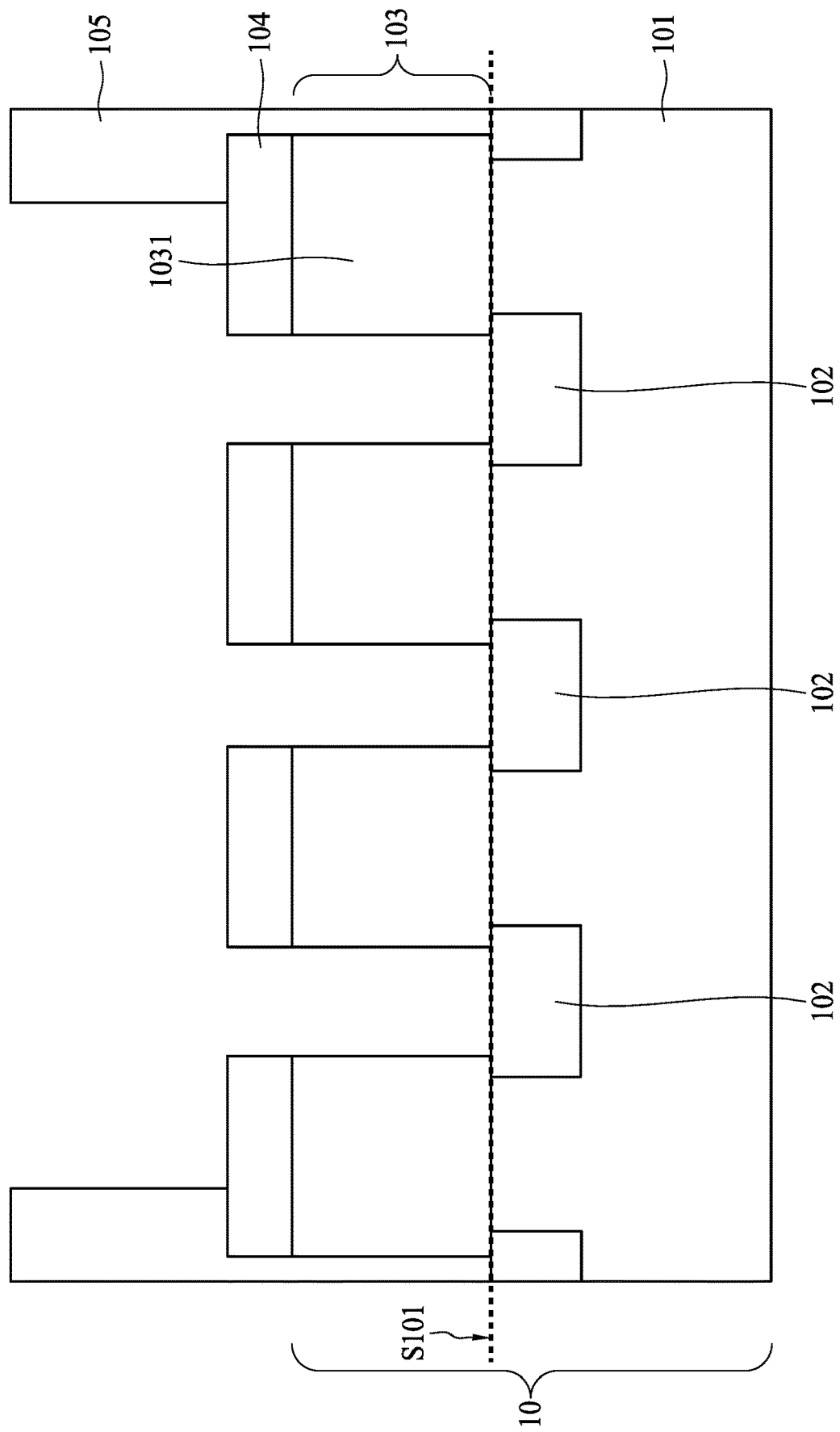

Referring to FIG. 13, prior to formation of a metal layer 106 in accordance with (O24) of the method M20, a portion of the dielectric layer 105 over the metal oxide layer 104 and between the remained portions of the metal oxide layer 104 over the isolations 1032 are removed. In some embodiments of the present disclosure, material of the isolations 1032 and that of the dielectric layer 105 are the same. In some embodiments of the present disclosure as shown in FIG. 13, the isolations 1032 between the metal gate structures 1031 are removed concurrently in the operation of removal of the portion of the dielectric layer 105. The isolations 1032 are removed to form a layer of gate structures 103 including a plurality of metal gate structures 1031. The source/drain regions 102 are exposed from the gate structures 103, the metal oxide layer 104 and the dielectric layer 105.

Figure 14:
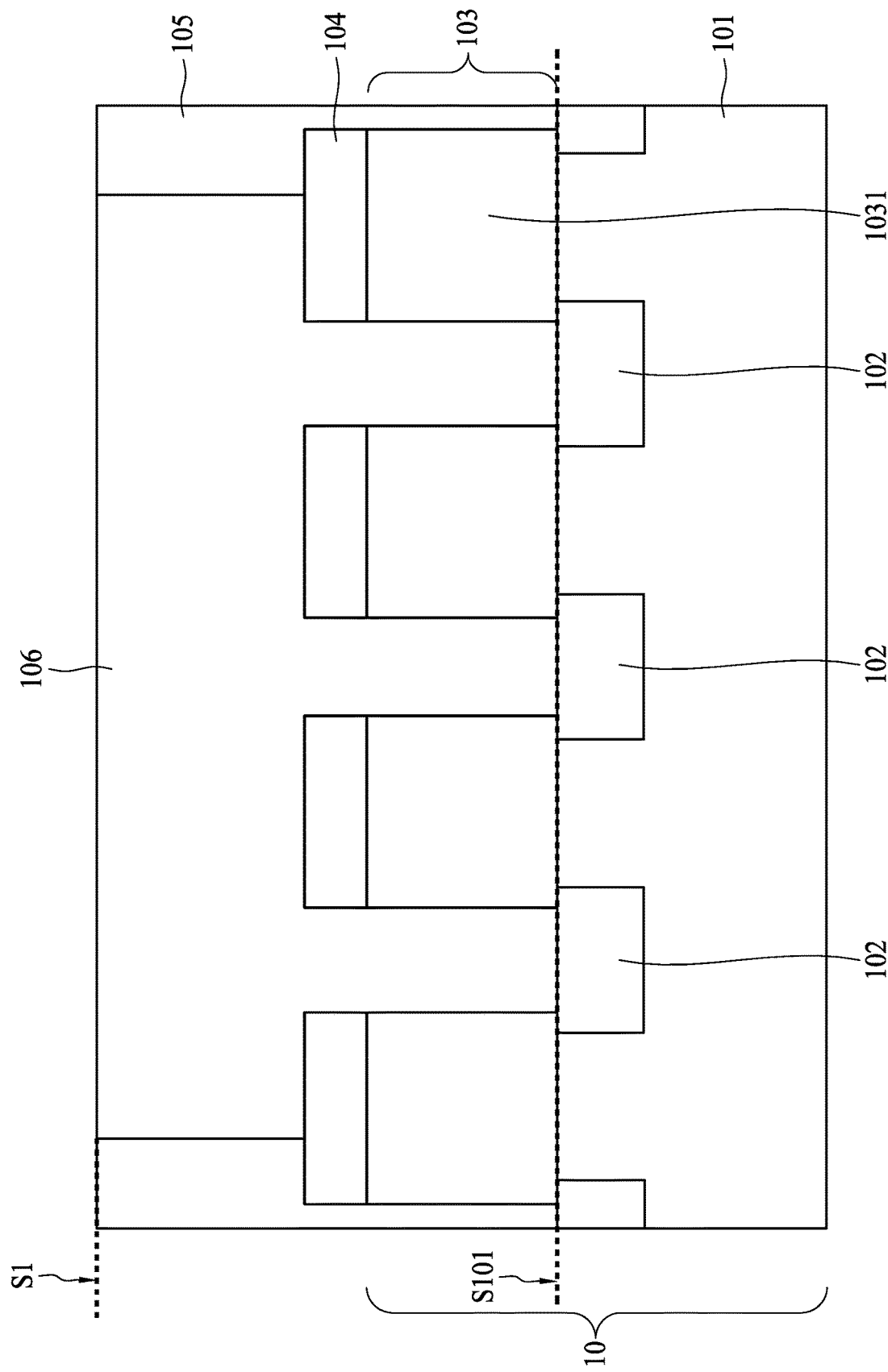

Referring to FIG. 14 and in accordance with (O24) of the method M20, the metal layer 106 is formed over the metal oxide layer 104. The metal layer 106 also fills between the gate structures 103, where the isolations 1032 was disposed, and between the remained portions of the metal oxide layer 104 as well. The metal layer 106 is disposed adjacent to the dielectric layer 105. A metal-dielectric surface S1 is exposed, wherein the first metal-dielectric surface Si includes a metal portion of the metal layer 106 and a dielectric portion of the dielectric layer 105.

Figure 15:
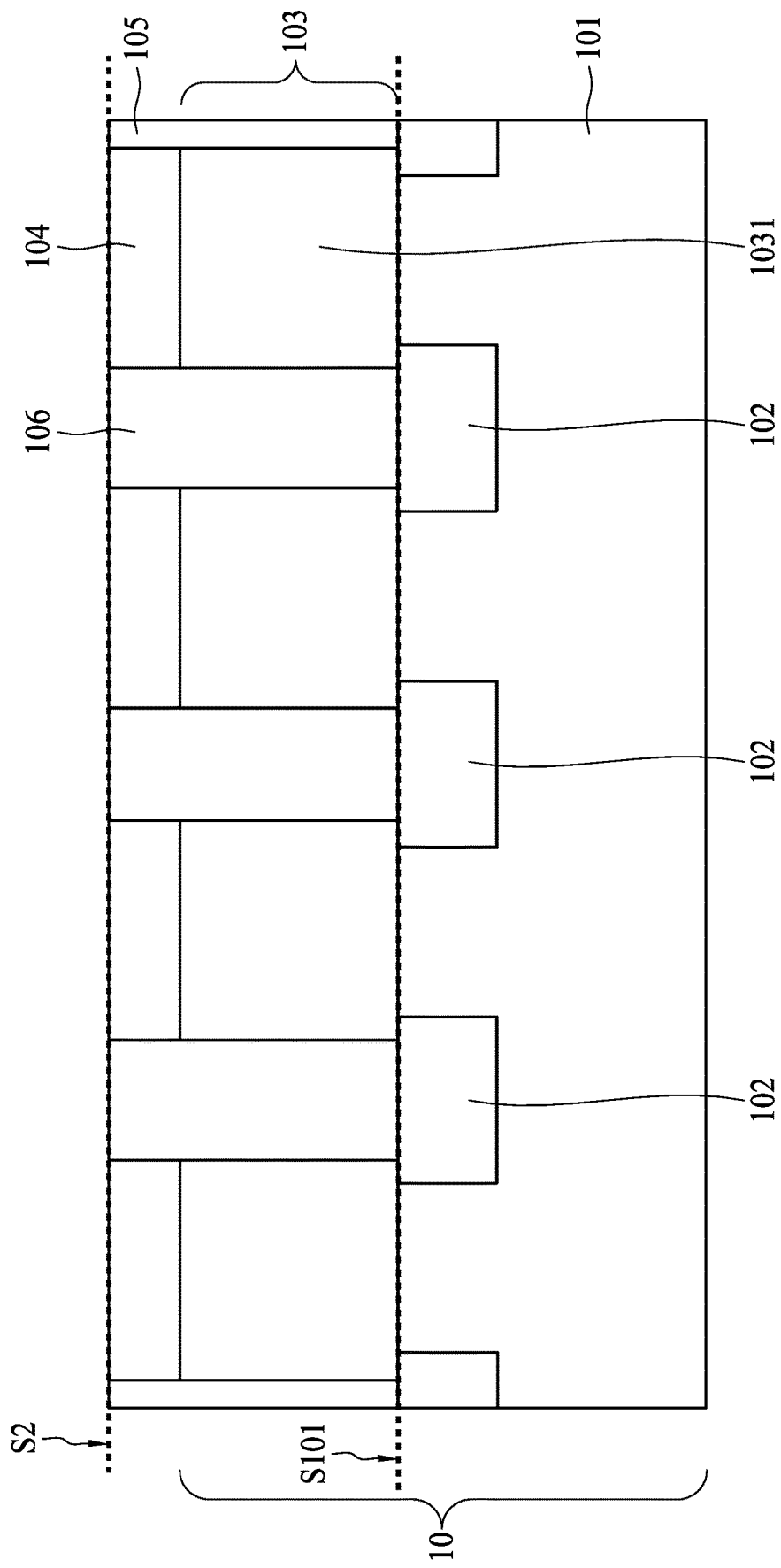

Referring to FIG. 15 and in accordance with (O25) of the method M20, the metal-dielectric surface Si is targeted to a CMP operation. The CMP operation is performed to remove a portion of the metal layer 106 and a portion of the dielectric layer 105 simultaneously, wherein the slurry used in the CMP operation includes a ceria compound. The slurry used herein is similar to the slurry as illustrate above in method M10 and FIG. 1 to FIG. 8, and redundant description is omitted herein for the purpose brevity.

Figure 16:
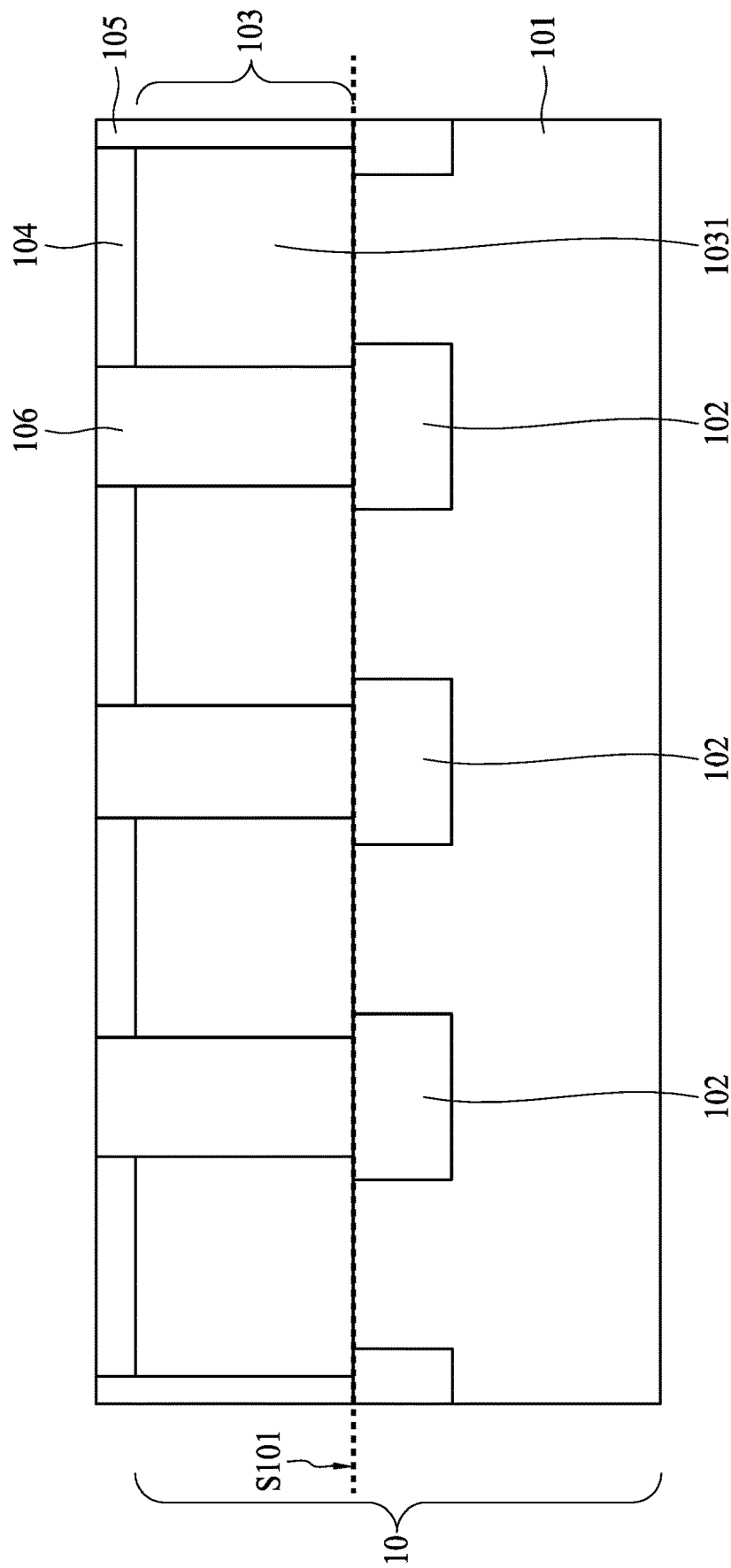

In some embodiments of the present disclosure, the CMP operation stops at an exposure of the metal oxide layer 104, wherein a metal-dielectric surface S2 is provided. The metal-dielectric surface S2 includes a metal oxide portion of the metal oxide layer 104 and a metal portion of the metal layer 106, and optionally a dielectric portion of the dielectric layer 105. In some embodiments, the CMP operation removes a portion of the metal oxide layer 104 before the CMP operation is terminated as shown in FIG. 16. The CMP operation is continuously performed on the metal-dielectric surface S2 using the same slurry as to the metal-dielectric surface S1. However, similar to the mechanism of the slurry removal rates to metal, dielectric and metal oxide materials, the removed portion of the metal oxide in thickness can be very limited due to high selectivity between the metal oxide layer 104 and the metal layer 106. Loss of the metal oxide layer 104 and a thickness of the metal layer 106 between the gate structures 103 can be controlled.

Table 1 provides different embodiments of the present disclosure of different slurries, the slurries of the embodiments are provided to the semiconductors with the same structures as shown in FIG. 14 under same CMP conditions. Wherein the metal layer 106 is cobalt (Co), the metal oxide layer 104 is zirconium dioxide ($ZrO_2$), and the dielectric layer 105 is silicon dioxide ($SiO_2$). In the embodiments listed in Table 1, the abrasive is ceria dioxide ($CeO_2$), the removal rate regulator is an organic acid having a molar mass of 5000 g/mol, and the buffering agent is citric acid.

TABLE 1

| Condition | Embodiment | | | | | |
| --- | --- | --- | --- | --- | --- | --- |
|  | 1 | 2 | 3 | 4 | 5 | 6 |
| pH value | 9.5 | 9 | 8.5 | 9 | 9.5 | 9.5 |
| $CeO_2$ (wt % to slurry) | 0.25 | 0.15 | 0.10 | 0.05 | 0.10 | 0.05 |
| Removal rate regulator (wt % to slurry) | 0.60 | 0.48 | 0.48 | 0.48 | 0.60 | 0 |
| Buffering agent (wt % to slurry) | <0.1 | <0.1 | <0.1 | <0.1 | <0.1 | <0.1 |
| $SiO_2$ removal rate (A/min) | 435 | 460 | 140 | 80 | 630 | 250 |
| Co removal rate (A/min) | 373 | 300 | 150 | 520 | 430 | 32 |
| $ZrO_2$ removal rate (A/min) | <1 | <1 | <1 | 2 | <1 | 1 |

As shown in Embodiment 1 to Embodiment 6 in the Table 1 above, in some embodiments of the present disclosure, the ceria compounds of the abrasives have a weight percentage in a range from 0.05 wt % to 0.25 wt % to the slurry to achieve desired removal rates with respect to substances to be removed. In some embodiments of the present disclosure, the slurry has a removal rate selectivity of the metal to the metal oxide greater than 30 (e.g. the minimum selectivity ratio Co/$ZrO_2$ among the 6 embodiments is 32, as shown in the Embodiment 6). In some embodiments of the present disclosure, the slurry has a removal rate selectivity of the dielectric material to the metal oxide greater than 30 (e.g. the minimum selectivity ratio $SiO_2$/$ZrO_2$ of the 6 embodiments is 40, as shown in the Embodiment 4). In some embodiments of the present disclosure, a pH value is controlled to be greater than 7 to achieve desired removal rates with respect to substances to be removed. In some embodiments of the present disclosure, the buffering agent is less than 1 wt % to the slurry. Therefore, some embodiments of the present disclosure provide a slurry including ceria compounds as abrasives is suitable for polishing a metal-dielectric surface. The slurry has very limited removal rate to the metal oxide materials, and loss metal oxide layer 104 can be reduced.

Some embodiments of the present disclosure provide a slurry. The slurry includes an abrasive including a ceria compound; a removal rate regulator to adjust removal rates of the slurry to metal and to dielectric material; and a buffering agent to adjust a pH value of the slurry, wherein the slurry comprises a dielectric material removal rate higher than a metal oxide removal rate.

Some embodiments of the present disclosure provide a method for manufacturing a semiconductor. The method includes: receiving a substrate having a semiconductor fin, a source/drain region in the semiconductor fin, and a gate structure over the semiconductor fin and adjacent to the source/drain region from a cross sectional perspective; forming a metal oxide layer over the gate structure; forming a dielectric layer over the metal oxide layer; forming a metal layer over the metal oxide layer; and performing a chemical mechanical polish (CMP) operation to remove a portion of the dielectric layer and a portion of the metal layer, wherein a slurry used in the CMP operation comprises a ceria compound.

Some embodiments of the present disclosure provide a method for planarizing a metal-dielectric surface. The method includes: providing a slurry to a first metal-dielectric surface, wherein the first metal-dielectric surface comprises a silicon oxide portion and a metal portion, and wherein the slurry comprises a ceria compound; and performing a chemical mechanical polish (CMP) operation using the slurry to simultaneously remove the silicon oxide portion and the metal portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor, comprising:
   forming a metal oxide layer over a gate structure over a substrate;
   forming a dielectric layer over the metal oxide layer;
   forming a metal layer over the metal oxide layer; and performing a chemical mechanical polish (CMP) operation to remove a portion of the dielectric layer and a portion of the metal layer, the CMP operation stopping at the metal oxide layer, wherein a slurry used in the CMP operation comprises a ceria compound.

2. The method of claim 1, wherein a weight percentage of the ceria compound in the slurry is in a range from 0.05 wt % to 0.25 wt %.

3. The method of claim 1, wherein the slurry further comprises a removal rate regulator to adjust removal rates of the slurry to the metal layer and to the dielectric layer.

4. The method of claim 1, wherein the slurry has a dielectric material removal rate higher than a metal oxide removal rate.

5. The method of claim 1, wherein the metal layer is adjacent to the dielectric layer and filling between the gate structures.

6. The method of claim 1, wherein the ceria compound comprises at least one of ceric dioxide ($CeO_2$), cerium trioxide ($Ce_2O_3$), ceric hydroxide ($Ce(OH)_4$), cerium-nitride, cerium-fluoride and cerium-sulfide.

7. The method of claim 1, wherein the metal layer comprises pure metal and alloy, the pure metal is selected from one of tungsten (W), cobalt (Co), ruthenium (Ru), copper (Cu), and alloy comprises at least one of tungsten (W), cobalt (Co), ruthenium (Ru), copper (Cu).

8. The method of claim 1, wherein the metal oxide layer comprises at least one of zirconium dioxide ($ZrO_2$), hafnium zirconium oxide ($HfZrO_x$), hafnium silicon oxide ($HfSiO_x$), hafnium silicon oxynitride (HfSiON), zirconium silicon oxide ($ZrSiO_x$), hafnium zirconium silicon oxide ($HfZrSiO_x$), aluminum oxide ($Al_2O_3$), hafnium aluminum oxide ($HfAlO_x$), hafnium aluminum nitride ($HfAlN_x$), zirconium aluminum oxide ($ZrAlO_x$), lanthanum oxide ($La_2O_3$), titanium dioxide ($TiO_2$), ytterbium(III) oxide ($Yb_2O_3$), yttrium (III) oxide ($Y_2O_3$), hafnium oxide ($HfO_2$) and tantalum pentoxide ($Ta_2O_5$), and x is a positive integer.

9. The method of claim 1, wherein the dielectric layer comprises at least one of silicon dioxide ($SiO_2$), silicon nitride (SiN), boron nitride (BN), germanium nitride (GeN), silicon carbonitride (SiCN), silicon oxycarbonitride (SiOCN), silicon oxynitride (SiON), silicon oxycarbide (SiOC).

10. The method of claim 9, wherein the slurry has a removal rate selectivity of the dielectric portion to the metal oxide portion greater than 30.

11. A method for planarizing a metal-dielectric surface, comprising:
receiving a substrate having a first metal-dielectric surface, wherein a dielectric portion and a metal portion are exposed at the first metal-dielectric surface; and
performing a chemical mechanical polish (CMP) operation using a slurry to concurrently remove the dielectric portion and the metal portion, wherein the slurry comprises a ceria compound.

12. The method of claim 11, wherein a second metal-dielectric surface is generated after the CMP operation, and the ceria compound is over the second metal-dielectric surface after the CMP operation.

13. The method of claim 12, wherein the ceria compound over the second metal-dielectric surface of the substrate is removed to by a post-CMP cleaning operation.

14. The method of claim 11, further comprising:
providing the slurry to a second metal-dielectric surface, wherein the second metal-dielectric surface comprises a metal oxide portion and the metal portion; and
performing a CMP operation using the slurry to concurrently remove the metal oxide portion and the metal portion, wherein a removal rate to the metal oxide portion is substantially slower than a removal rate to the metal portion.

15. The method of claim 11, wherein the slurry further comprises:
a removal regulator to adjust removal rates of the slurry to the metal portion and the dielectric portion; and
a buffering agent to adjust a PH value of the slurry.

16. A method for manufacturing a semiconductor, comprising:
receiving a semiconductor substrate;
forming a plurality of gate structures over the semiconductor substrate and a plurality of metal oxide portions over the plurality of gate structures;
forming a dielectric layer surrounding the plurality of gate structures and exposing portions of the semiconductor substrate between the gate structures;
forming a metal layer filling between the plurality of gate structures and disposed over the plurality of metal oxide portions; and
performing a planarization operation to remove a portion of the metal layer until an exposure of the metal oxide portions, wherein a slurry used in the planarization operation comprises a ceria compound, and the ceria compound in the slurry bonds to oxygens in the dielectric layer and attached to a planarized surface of the dielectric layer after the planarization operation.

17. The method of claim 16, wherein the slurry has a removal rate selectivity of the metal layer to the metal oxide layer greater than 30.

18. The method of claim 16, wherein a pH value of the slurry is in a range of from 5 to 12.

19. The method of claim 16, further comprising:
forming a plurality of isolations between the plurality of gate structures;
forming a metal oxide layer over the plurality of gate structures and the plurality of isolations; and
removing portions of the metal oxide layer over the isolations, thereby forming the plurality of metal oxide portions.

20. The method of claim 19, further comprising:
forming a dielectric material covering the metal oxide portions, the gate structures and the isolations;
removing a portion of the dielectric material thereby forming the dielectric layer, wherein the isolations are exposed after the removal of the portion of the dielectric material; and
removing the isolations thereby exposing the portions of the substrate.

* * * * *